(12) United States Patent
Jung et al.

(10) Patent No.: US 12,197,891 B2
(45) Date of Patent: Jan. 14, 2025

(54) COMPUTING DEVICE FOR PERFORMING DIGITAL PULSE-BASED CROSSBAR OPERATION AND METHOD OF OPERATING THE COMPUTING DEVICE

(71) Applicant: SAMSUNG ELECTRONICS CO., LTD., Suwon-si (KR)

(72) Inventors: Seungchul Jung, Suwon-si (KR); Sang Joon Kim, Hwaseong-si (KR); Sungmeen Myung, Suwon-si (KR); Seok Ju Yun, Hwaseong-si (KR); Seungkeun Yoon, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 37 days.

(21) Appl. No.: 17/702,170

(22) Filed: Mar. 23, 2022

(65) Prior Publication Data
US 2023/0155578 A1    May 18, 2023

(30) Foreign Application Priority Data
Nov. 15, 2021   (KR) .......................... 10-2021-0156660

(51) Int. Cl.
G06F 7/544    (2006.01)
H03K 3/037   (2006.01)
H03K 21/08   (2006.01)

(52) U.S. Cl.
CPC .......... *G06F 7/5443* (2013.01); *H03K 3/037* (2013.01); *H03K 21/08* (2013.01); *G06F 2207/4824* (2013.01)

(58) Field of Classification Search
CPC ...................... G06F 7/5443; G06F 2207/4824
See application file for complete search history.

(56) References Cited

U.S. PATENT DOCUMENTS

| | | |
|---|---|---|
| 5,771,362 A | 6/1998 | Bartkowiak et al. |
| 7,812,629 B2 | 10/2010 | Kelem et al. |

(Continued)

FOREIGN PATENT DOCUMENTS

| | | |
|---|---|---|
| KR | 10-2006-0023963 A | 3/2006 |
| KR | 10-2018-0125283 A | 11/2018 |

(Continued)

OTHER PUBLICATIONS

Extended European search report issued on Jan. 2, 2023, in counterpart European Patent Application No. 22186463.0 (8 pages in English).

*Primary Examiner* — Patrick O Neill
(74) *Attorney, Agent, or Firm* — NSIP Law

(57) ABSTRACT

A computing device for performing a digital pulse-based crossbar operation and a method of operating the computing device. The computing device includes a plurality of input lines to which a pulse is selectively input in a sequential manner based on a corresponding input signal; a plurality of output lines crossing the input lines; a plurality of elements, each element being disposed at a cross point between a corresponding input line and a corresponding output line to transfer, to the corresponding output line, a pulse input to the corresponding input line in response to a corresponding weight being a first value; and a plurality of pulse counters, each pulse counter counting a number of pulses output from a corresponding output line.

20 Claims, 14 Drawing Sheets

(56) References Cited

U.S. PATENT DOCUMENTS

| | | |
|---|---|---|
| 10,169,297 B2 | 1/2019 | Buchanan |
| 10,339,202 B2 | 7/2019 | Buchanan |
| 11,023,807 B2 | 6/2021 | Narayan et al. |
| 2019/0108193 A1 | 4/2019 | Buchanan |
| 2019/0362787 A1* | 11/2019 | Lu ................. G11C 13/0069 |
| 2020/0311523 A1* | 10/2020 | Hoang ............... G06F 7/496 |
| 2021/0192325 A1* | 6/2021 | Hoang ............ G11C 13/0069 |
| 2021/0210138 A1 | 7/2021 | Lu et al. |
| 2021/0303265 A1 | 9/2021 | Yudanov |
| 2021/0365241 A1 | 11/2021 | Huang et al. |
| 2022/0004852 A1* | 1/2022 | Ju ....................... G11C 11/54 |
| 2022/0027130 A1* | 1/2022 | Kashmiri ............ G06N 3/048 |
| 2022/0075601 A1* | 3/2022 | Lin .................... G06F 7/5443 |
| 2023/0113627 A1* | 4/2023 | Kim ................... H10B 61/20 706/34 |

FOREIGN PATENT DOCUMENTS

| | | |
|---|---|---|
| KR | 10-2019-0029406 A | 3/2019 |
| KR | 10-2019-0058254 A | 5/2019 |
| KR | 10-2019-0106185 A | 9/2019 |
| KR | 10-2021-0028063 A | 3/2021 |
| KR | 10-2021-0050243 A | 5/2021 |
| KR | 10-2021-0093126 A | 7/2021 |
| KR | 10-2021-0119805 A | 10/2021 |
| WO | WO 2020/238889 A1 | 12/2020 |

* cited by examiner

COMPUTING DEVICE FOR PERFORMING DIGITAL PULSE-BASED CROSSBAR OPERATION AND METHOD OF OPERATING THE COMPUTING DEVICE

CROSS-REFERENCE TO RELATED APPLICATIONS

This application claims the benefit under 35 USC § 119(a) of Korean Patent Application No. 10-2021-0156660 filed on Nov. 15, 2021, in the Korean Intellectual Property Office, the entire disclosures of which are incorporated herein by reference for all purposes.

BACKGROUND

1. Field

The following description relates to a computing device for performing a digital pulse-based crossbar operation and a method of operating the computing device.

2. Description of Related Art

A vector matrix multiplication operation, or a multiply-accumulate (MAC) operation, may affect the performance of applications in various fields. For example, the MAC operation may be performed for machine learning and authentication of a neural network including multiple layers. An input signal may form an input vector, and be data of images, byte streams, or other data sets. An input signal may be multiplied by a weight, and an output vector may be obtained from an accumulated MAC operation result. The output vector may then be provided as an input vector for a subsequent layer. The MAC operation is iterated for a plurality of layers, and thus the processing performance of the neural network may depend on the performance of the MAC operation.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a computing device includes a plurality of input lines to which a pulse is selectively input in a sequential manner based on a corresponding input signal; a plurality of output lines crossing the input lines; a plurality of elements, each element being disposed at a cross point between a corresponding input line and a corresponding output line and configured to transfer, to the corresponding output line, a pulse input to the corresponding input line in response to a corresponding weight being a first value; and a plurality of pulse counters, each pulse counter being configured to count a number of pulses output from a corresponding output line.

The pulse may be input to one or more of the input lines in response to the input signal being a first value, and the pulse may not be input to one or more of the input lines in response to the input signal being a second value.

Each of the elements may be a diode.

The computing device may further a plurality of second elements, and each of the second elements may be configured to transfer, to a ground, a pulse transferred to a corresponding output line.

Each of the elements may be a transistor. One end of each transistor may be connected to the corresponding input line and another end may be connected to the corresponding output line, and a gate end may be connected to a selection line corresponding to the respective input line. When the pulse is selectively input based on the input signal, a selection signal may be input to the selection line.

The selection signal may be a second pulse having a width greater than a width of the pulse input to the respective input line.

Each of the pulse counters may count the number of pulses transferred from a corresponding output line during an entire cycle in which the pulse is selectively input to the input lines.

A result of a multiply-accumulate (MAC) operation based on a binary AND operation between input signals input to the input lines and weights of the elements may be determined based on values output from the pulse counters.

Each of the elements may include a first transistor having a first end connected to a corresponding input line and another first end connected to a second end of a second transistor, and a first gate end connected to a selection line corresponding to the input line, and the second transistor having the second end connected to the other first end of the first transistor and another second end connected to a corresponding output line, and a second gate end connected to a corresponding first memory device. The first memory device may store a corresponding weight. In response to the weight stored in the first memory device being the first value, the second transistor may short-circuit the second end and the other second end. In response to the weight being a second value, the second transistor may open the second end and the other second end.

Each of the elements may be a memory device having one end connected to a corresponding input line and another end connected to a corresponding output line, and a control gate end connected to a selection line corresponding to the input line and a floating gate end configured to store a corresponding weight. In response to the weight being the first value, the memory device may short-circuit the one end and the other end. In response to the weight being a second value, the memory device may open the one end and the other end.

Each of the elements may include a transistor having a first end connected to a corresponding input line and another first end connected to a second end of a resistive memory, and a first gate end connected to a selection line corresponding to the input line, and the resistive memory having the second end connected to the other first end of the transistor and another second end connected to the respective output line, and configured to have a resistance value corresponding to a corresponding weight. In response to the weight being the first value, the resistive memory may have a first resistance value. In response to the weight being a second value, the resistive memory may have a second resistance value that is greater than the first resistance value. Each of reference resistors disposed between a corresponding output line and a ground may have a reference resistance value between the first resistance value and the second resistance value.

The computing device may further include a plurality of second input lines to which a pulse is selectively input in a sequential manner based on an opposite signal of the input signal, and a plurality of complementary elements each disposed at a cross point between a corresponding second input line and a corresponding output line in response to an opposite value of the weight being a first value, and configured to transfer a pulse input to the corresponding second input line to the corresponding output line. Each of the elements and each of the complementary elements may have a corresponding gate end to which a selection line corresponding to a corresponding input line is connected. When the pulse is selectively input based on the input signal, a selection signal may be input to the corresponding selection line.

A result of a MAC operation based on a binary exclusive NOR (XNOR) operation between input signals input to the input lines and weights of the elements may be determined based on values output from the pulse counters.

In response to the input signal being an n-bit input signal, each of the input lines may selectively receive one or more pulses during 2n cycles according to the input signal.

In response to the input signal being a multi-bit input signal, each of the input lines may selectively receive sequentially a pulse according to a value corresponding to the same digit in the input signal, and each of the pulse counters may apply a pulse transferred from a corresponding output line to a corresponding digit in a multi-bit output signal, based on a digit in the input signal corresponding to the pulse output from the corresponding output line.

In response to the weight being an n-bit weight, the elements may be disposed in n output lines corresponding to the weight and in the input line, and configured to selectively transfer a pulse input to the input line to one or more of the n output lines based on the weight. An output signal may be determined by applying, to values output from pulse counters disposed respectively in the n output lines, different weights that are based on positions of the n output lines.

In response to the input signal being the second value, a cycle during which the pulse based on the input signal is not input to a corresponding input line may be omitted.

Among input signals input to the input lines, two or more input signals for which output lines to which a pulse is to be transferred by one or more of the elements do not overlap may be simultaneously input to a corresponding input line.

In another general aspect, a method of operating a computing device includes selectively inputting a pulse to a plurality of input lines according to an input signal in a sequential manner, and counting, by a plurality of pulse counters each disposed in a corresponding output line, the number of pulses transferred to a corresponding output line by a plurality of elements each disposed at a cross point between a corresponding input line and the respective output line. The input lines may cross the output lines. In response to a corresponding weight being a first value, each of the elements may transfer a pulse input to a corresponding input line to a corresponding output line.

The selectively inputting the pulse may include inputting the pulse to the input line in response to the input signal being the first value, and not inputting the pulse to the input line in response to the input signal being a second value.

In another general aspect, a computing device includes a crossbar array including input lines and output lines crossing the input lines at a plurality of cross points; and a plurality of elements, each element being disposed at one of the cross points and configured to transfer a pulse applied to the input line corresponding to the respective cross point to the output line corresponding to the respective cross point only when a weight associated with the respective cross point is a first value.

Elements disposed along a common input line may be configured to selectively receive an input pulse based on an input signal.

The input signal may be a binary signal, and the elements disposed along the common input line may be configured to receive the input pulse in a case in which the binary signal is 1.

The computing device may include a plurality of pulse counters, and each pulse counter may be connected to a respective output line and configured to count a number of pulses output from the respective output line.

Other features and aspects will be apparent from the following detailed description, the drawings, and the claims.

Figure 1:
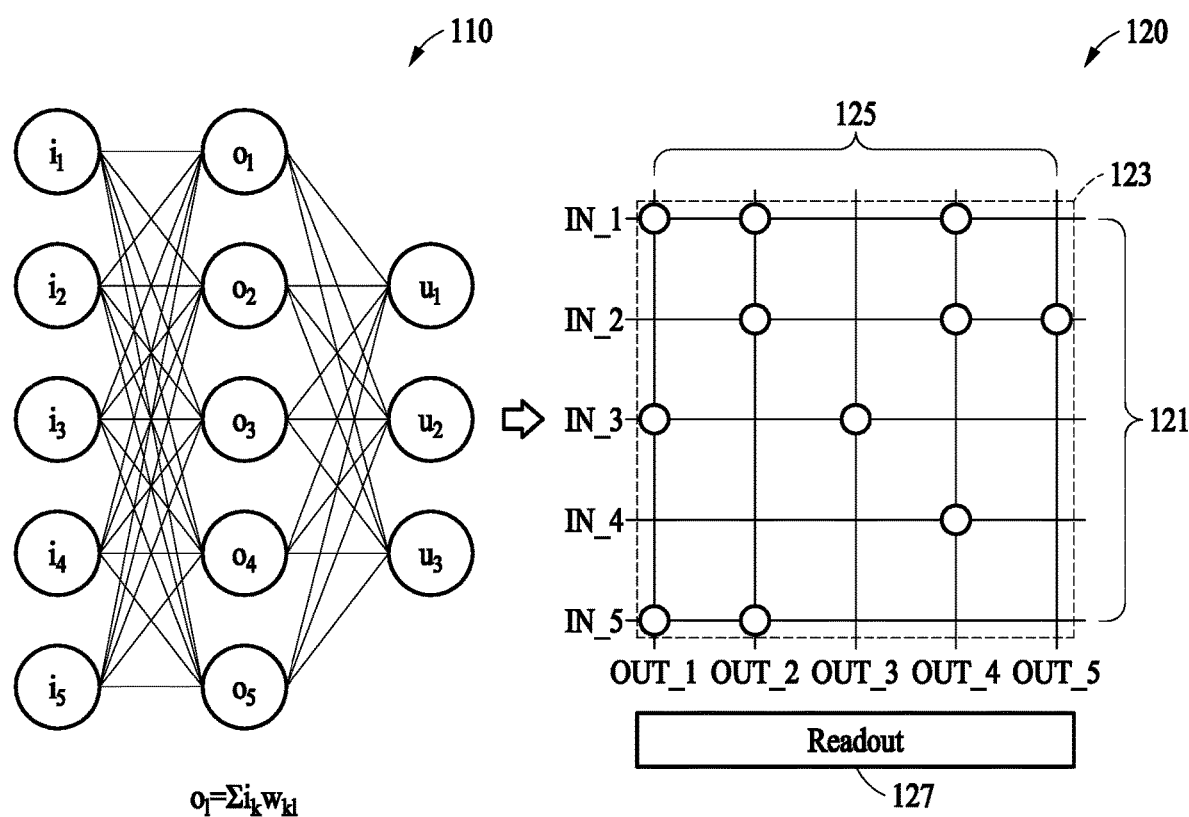
FIG. 1 illustrates an example of an in-memory computing circuit.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

The terminology used herein is for describing various examples only and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Throughout the specification, when a component is described as being "connected to," or "coupled to" another component, it may be directly "connected to," or "coupled to" the other component, or there may be one or more other components intervening therebetween. In contrast, when an element is described as being "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in the examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and based on an understanding of the disclosure of the present application. Terms, such as those defined in commonly used dictionaries, are to be interpreted as having a meaning that is consistent with their meaning in the context of the relevant art and the disclosure of the present application and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments. Hereinafter, examples will be described in detail with reference to the accompanying drawings, and like reference numerals in the drawings refer to like elements throughout.

FIG. 1 illustrates an example of an in-memory computing circuit.

In the example of FIG. 1, illustrated are a neural network 110 and an in-memory computing circuit (or simply an IMC circuit) 120.

In an example, a computing device may process the neural network 110 through in-memory computing. In-memory computing may correspond to an operation performed using a memory to which a computing function is added. The computing device may include a hardware accelerator using in-memory computing. The neural network 110 may include one or more layers each including a plurality of nodes. A plurality of nodes of a layer may be connected to a plurality of nodes of another layer through a connection line for which a weight may be set. For example, an output $o_1$ of one node may be determined based on input values $i_1$, $i_2$, $i_3$, and $i_4$ propagated from other nodes of a previous layer connected to the node and on weights $w_{11}$, $w_{21}$, $w_{31}$, and $w_{41}$ of connection lines of the node. For example, a lth output $o_l$ among L output values may be represented by Equation 1 below. In this example, L denotes an integer greater than or equal to 1, and l denotes an integer greater than or equal to 1 and less than or equal to L.

$$o_l = \Sigma i_k w_{kl} \qquad \text{Equation 1:}$$

In Equation 1, $i_k$ denotes a kth input among P inputs, and $w_{kl}$ denotes a weight set between the kth input and a lth output. P denotes an integer greater than or equal to 1, and k denotes an integer greater than or equal to 1 and less than or equal to P. That is, an input and output between nodes in the neural network 110 may be represented by a weighted sum between the input and a weight. The weighted sum may correspond to a multiplication and iterative additions between a plurality of inputs and a plurality of weights, and may also be referred to as a multiply-accumulate (MAC) operation. A computing device performing the MAC operation may be referred to a multiplier-accumulator or an MAC unit, and a circuit in which the MAC operation is performed may be referred to as an MAC circuit. The circuit in which the MAC operation is performed may also be referred to as an in-memory computing circuit, for example, the in-memory computing circuit 120, in that the MAC operation is performed using a memory to which a computing function is added. In addition, a device or circuit performing the MAC operation may be simply referred to as a computing device.

The in-memory computing circuit 120 illustrated in FIG. 1 may be a crossbar MAC operator configured to perform the MAC operation based on a digital pulse. The in-memory computing circuit 120 may include a plurality of row lines 121, a plurality of elements 123, and a plurality of column lines 125. An element, for example, the elements 123, used herein may also be referred to a device.

The row lines 121 may sequentially receive an input signal. The input signal may be a binary signal having 0 or 1. For example, when an input signal IN_1 is 1 (or "high"), a pulse may be input to a first row line in a first cycle corresponding to the input signal IN_1. When an input signal IN_2 is 0 (or "low"), a pulse may not be input to a second row line in a second cycle corresponding to the input signal IN_2. The row lines 121 may also be referred to herein as a plurality of input lines for convenience of description.

In an example, an input signal may be sequentially input to the row lines 121, and this may be to prevent pulses based on two or more input signals from colliding in the same column line. When such a collision does not occur in the same column line, the pulses based on the two or more input signals may be input to row lines simultaneously. In the example of FIG. 1, even when each of the input signal IN_2 and an input signal IN_3 is 1, and pulses based on these input signals are input to a second row line and a third row line, respectively, the input signal IN_2 and the input signal IN_3 may be simultaneously input to the corresponding row lines, because elements disposed in the respective row lines are disposed crossly from each other. When the size of the neural network 110 is reduced, such a case in which a collision does not occur in a column line may be applied more to reduce cycles performed for computation.

In another example, when an nth input signal is 0 and an n+1th input signal is 1, a pulse may not be input to an nth row line in an nth cycle corresponding to the nth input signal. Instead, the nth input signal may be skipped, and a pulse corresponding to the n+1th input signal may be input to an n+1th row line. As described, skipping an input signal being 0 and inputting a subsequent input signal may reduce the entire cycle for performing computation.

The elements 123 may each be disposed at a cross point between a corresponding row line and a corresponding column line. A weight may be a binary signal having 0 or 1. For example, the elements 123 may each be disposed or not be disposed at a cross point between a corresponding row line and a corresponding column line based on a corresponding weight. For example, an element with the weight of 1 may be disposed at a cross point between a corresponding row line and a corresponding column line, and transfer a pulse input to the row line to the column line. In contrast, an element with the weight of 0 may not be disposed at a cross point between a corresponding row line and a corresponding column line, and may not transfer a pulse to the column line even though the pulse is input to the row line.

In the example of FIG. 1, a weight (1, 1) corresponding to a first row line and a first column line may be 1, and an element may be disposed at a cross point between the first row line and the first column line. Thus, a pulse input to the first row line may be transferred to the first column line according to the input signal IN_1. In contrast, a weight (1, 3) corresponding to the first row line and a third column line may be 0, and an element may not be disposed at a cross point between the first row line and the third column line. Thus, a pulse input to the first row line may not be transferred to the third column line according to the input signal IN_1.

The elements 123 may each be referred to as a memory cell or a bit-cell including an MAC operation function and include, for example, at least one of a diode, a transistor (e.g., a metal-oxide-semiconductor field-effect transistor (MOSFET), a memory device (e.g., a static random-access memory (SRAM)), and a resistive memory, which will be described in detail with reference to the accompanying drawings.

The column lines 125 may cross the row lines 121, each of the column lines 125 may output a pulse transferred from a corresponding input line through a corresponding element. The column lines 125 may also be referred to herein as a plurality of output lines for convenience of description. Among the elements 123, elements disposed along the same row line may receive the same input signal, and elements disposed along the same column line may transfer a pulse for the same output.

A readout unit 127 may determine a result of a MAC operation by counting the number of pulses output from each of the column lines 125. A pulse output from each column line may be transferred to a pulse counter connected to each column line, and the number of pulses output from each column line may be counted thereby.

In consideration of the elements 123, the in-memory computing circuit 120 illustrated in FIG. 1 may perform the following MAC operation represented by Equation 2.

$$\begin{bmatrix} OUT\_1 \\ OUT\_2 \\ OUT\_3 \\ OUT\_4 \\ OUT\_5 \end{bmatrix} = \begin{bmatrix} 1 & 0 & 1 & 0 & 1 \\ 1 & 1 & 0 & 0 & 1 \\ 0 & 0 & 1 & 0 & 0 \\ 1 & 1 & 0 & 1 & 0 \\ 0 & 1 & 0 & 0 & 0 \end{bmatrix} \begin{bmatrix} IN\_1 \\ IN\_2 \\ IN\_3 \\ IN\_4 \\ IN\_5 \end{bmatrix} \quad \text{Equation 2}$$

A digital pulse-based crossbar binary MAC operator may be implemented by performing a multiplication operation for each bit digit in each element included in the in-memory computing circuit 120. By counting the number of pulses output from each column line through a pulse counter, the area and the power consumption of the readout unit 127 may be reduced, and the area of the in-memory computing circuit 120 may thus be minimized. Without an analog conversion, there may be no analog to digital re-conversion, and thus an analog-to-digital converter (ADC) that requires a great area and power may not be required. Thus, it may be free of noise that may inevitably occur in an analog operation. A crossbar array may include the row lines 121, the elements 123, and the column lines 125, and an array area may be minimized. In addition, a corresponding input signal may be sequentially applied to the row lines 121, and it may not need to receive simultaneously input signals. Thus, routing for the input signals may be simplified, and an additional storage space for the input signals may not be necessary.

Figure 2:
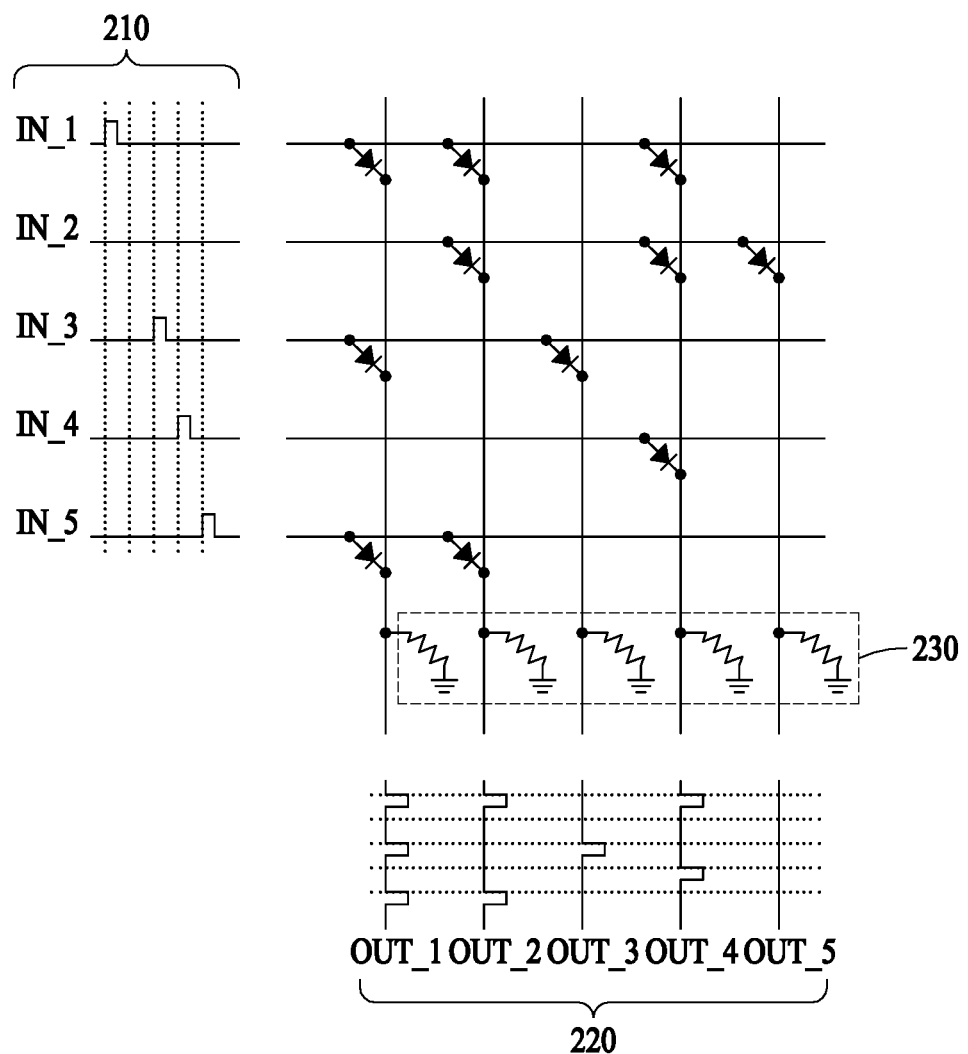
FIG. 2 illustrates an example of an operation of a computing device including a diode.

FIG. 2 illustrates an example of an operation of a computing device including a diode.

Referring to FIG. 2, each of the elements 123 of FIG. 1 may include a diode, and each diode may transfer a pulse applied to a corresponding input line to a corresponding output line.

When a neural network is fixed, each element may be implemented as a diode. The presence or absence of a diode may represent a corresponding weight value of 1 or 0. Based on the presence of absence of a diode, an AND operation between an input signal input to a corresponding input line and a weight corresponding to the presence or absence of the diode may be performed. Each diode may physically connect a corresponding input line and a corresponding output line. At a cross point at which a diode is not disposed, a corresponding input line and a corresponding output line may not be physically connected. Thus, the neural network may be physically fixed by hardware (e.g., a diode).

An operation performed in a crossbar array illustrated in FIG. 2 may be represented by Equation 2 above. For example, when a binary input signal {1, 0, 1, 1, 1} 210 is input, the following operation represented by Equation 3 may be performed in the crossbar array illustrated in FIG. 2.

$$\begin{bmatrix} 3 \\ 2 \\ 1 \\ 2 \\ 0 \end{bmatrix} = \begin{bmatrix} 1 & 0 & 1 & 0 & 1 \\ 1 & 1 & 0 & 0 & 1 \\ 0 & 0 & 1 & 0 & 0 \\ 1 & 1 & 0 & 1 & 0 \\ 0 & 1 & 0 & 0 & 0 \end{bmatrix} \begin{bmatrix} 1 \\ 0 \\ 1 \\ 1 \\ 1 \end{bmatrix} \quad \text{Equation 3}$$

The input signal {1, 0, 1, 1, 1} 210 may be sequentially input to input lines to prevent a collision in an output line. For example, a pulse based on a first input signal which is 1 may be input to a first input line in a first cycle, and a pulse based on a second input signal which is 0 may not be input to a second input line in a second cycle.

As described above, to reduce the entire cycle for which computation is performed, the second input signal which is 0 may be skipped, and a pulse based on a third input signal which is 1 may be input to a third input line in the second cycle. However, examples are not limited thereto. In addition, based on an arrangement of diodes, even when the pulse based on the third input signal which is 1 and a pulse based on a fourth input signal which is 1 are simultaneously input to the third input line and a fourth input line, respectively, the pulses may not collide in an output line. Thus, the pulse based on the third input signal and the pulse based on the fourth input signal may be simultaneously input to the corresponding input lines, and the entire computation cycle may thus be reduced. However, examples are not limited thereto.

During the entire cycle, a pulse may be sequentially input or not be input to corresponding input lines based on the input signal {1, 0, 1, 1, 1} 210, and the number of pulses output from a first output line may be three. Based on this, a first element of an output signal 220 may be determined to be 3. Similarly, remaining elements of the output signal 220 may be determined based on the number of pulses output from remaining output lines. A result of the AND multiplication operation between the input signal and the weight may be represented by the number of pulses output to output lines.

A diode connection may be pulled up from low to high. However, when an input is low, an output may be floating. To prevent this, a pull-down resistor 230 may be connected to each output line. For example, when a pulse is input to the first input line at an initial part of the first cycle, an output line may be pulled up from low to high due to a characteristic of the diode. Even when the input line is changed from high to row at a latter part of the first cycle, the output line may not be changed from high to low due to the characteristic of the diode. In this case, high in the output line may be transferred to the ground through the pull-down resistor 230, and the output line may be pulled down from high to low. Through the pull-down resistor 230, a state of the output line may be set to be low before a subsequent cycle is started (e.g., a latter part of the cycle), and thus the crossbar array may achieve operational stability.

In another example, the pull-down resistor 230 may be replaced with a pull-down transistor. In this example, one of an end (e.g., a source end) and another end (e.g., a drain end) of each pull-down transistor may be connected to a corresponding output line, and the other may be connected to the ground. In a latter part of a cycle in which a pulse is input or not input to a corresponding input line, a pulse having high may be input to a gate end of the pull-down transistor. When the pulse is input to the gate end in the latter part of the cycle, the pull-down transistor may connect the output line and the ground in the latter part of the cycle, and thus the output line may be pulled down from high to low.

Figure 3:
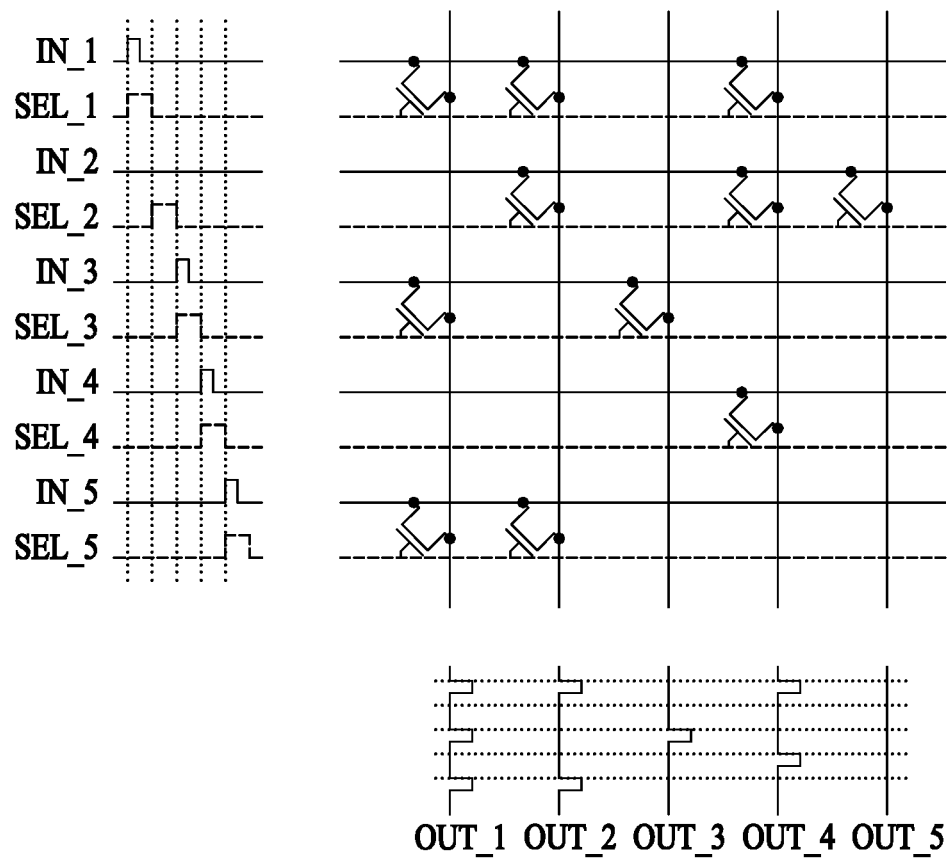
FIG. 3 illustrates an example of an operation of a computing device including a transistor.

FIG. 3 illustrates an example of an operation of a computing device including a transistor.

Referring to FIG. 3, each of the elements 123 of FIG. 1 may include a transistor (e.g., a MOSFET), and each transistor may transfer a pulse applied to a corresponding input line to a corresponding output line. The transistor may be used instead of the diode described above with reference to FIG. 2.

For example, when a neural network is fixed, each element may be implemented as a transistor. The presence or absence of a transistor may represent a corresponding weight value of 1 or 0. Based on the presence of absence of a transistor, an AND operation between an input signal input to a corresponding input line and a weight corresponding to the presence or absence of the transistor may be performed. Each transistor may physically connect a corresponding input line and a corresponding output line. At a cross point at which a transistor is not disposed, a corresponding input line and a corresponding output line may not be physically connected, and the neural network may be physically fixed by hardware (e.g., the transistor).

A selection signal input to a gate end of each transistor may be used. Each selection signal may be input in a direction in which an input signal is input, and may thus be input to a gate end of one or more transistors disposed in the same input line. Of each transistor, a source end may be connected to an input line, and a drain end may be connected to an output line.

The selection signal may be applied in the same cycle in which a corresponding input signal is input. A width of the selection signal which is high may be greater than a width of the input signal which is high. In addition, a time at which the selection signal falls from high to low may be behind a time at which the input signal falls from high to low. That is, even at a time at which the input signal is pulled down from high to low, the transistor may connect the input line and the output line, and thus the input line may act as the ground and the output line may be pulled down from high to low. Thus, for the pull-down of an output line, a separate resistor or transistor may not be necessary.

Figure 4:
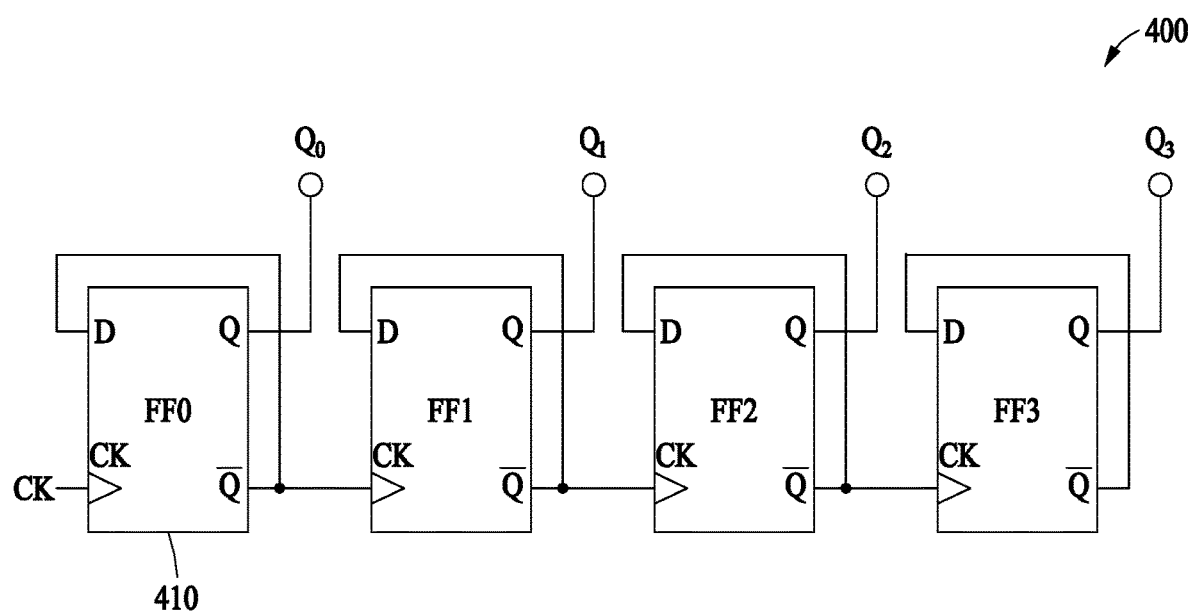
FIG. 4 illustrates an example of a pulse counter.

FIG. 4 illustrates an example of a pulse counter.

Referring to FIG. 4, illustrated is an asynchronous pulse counter 400 configured to count the number of pulses output from a corresponding output line. The pulse counter 400 may be disposed in each output line.

The pulse counter 400, which is an n-bit pulse counter, may include n T flip-flops. Although the pulse counter 400 is illustrated in FIG. 4 as including four T flip-flops for convenience of description, the configuration is not limited thereto.

For example, as illustrated, a corresponding output line may be connected to a first T flip-flop 410, and an output pulse may be input to a CK end of the first T flip-flop 410. The number of pulses output from a corresponding output line may be represented by a binary number output from a Q end of each T flip-flop. For example, when $Q_0=1$, $Q_1=0$, $Q_2=1$, and $Q_3=0$, a binary number which is 0101 may represent the number of pulses output from a corresponding output line, which is five.

Figure 5:
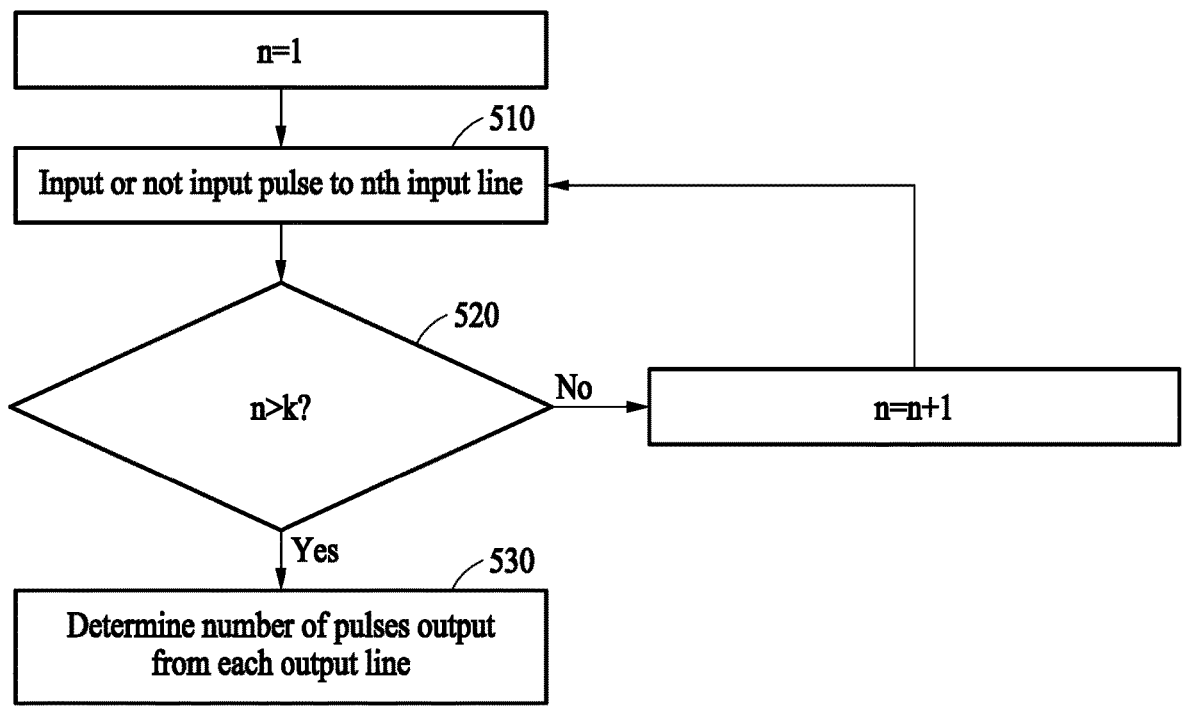
FIG. 5 illustrates an example of a method of operating a computing device.

FIG. 5 illustrates an example of a method of operating a computing device.

Operations to be described hereinafter with reference to FIG. 5 may be performed in sequential order, but are not necessarily performed in sequential order. For example, the order of the operations may change, and at least two of the operations may be performed in parallel. The operations, for example, operations 510 through 530, may be performed by at least one component of a computing device described herein.

In operation 510, the computing device may input or not input, to an nth input line, a pulse that is based on an input signal. For example, the computing device may input the pulse to the nth input line when the input signal is 1, and may not input the pulse to the nth input line when the input signal is 0. In this example, n denotes an integer that starts from 1.

In operation 520, the computing device may determine whether n is greater than k. k denotes a total number of input signals, which may be the same as the number of input lines. For example, when n is not greater than k, n may increase by 1, and operation 510 may be performed again. Through these operations, a pulse based on an input signal may be or may not be input to the input lines sequentially.

In operation 530, the computing device may determine the number of pulses output from each output line. A pulse applied to an input line may be transferred to a corresponding output line by an element disposed at a cross point between the input line and the output line, and the pulse transferred to the output line may be counted by a pulse counter connected to the output line. When a weight is a first value (e.g., 1), the element may transfer, to the output line, the pulse input to the input line.

Figure 6:
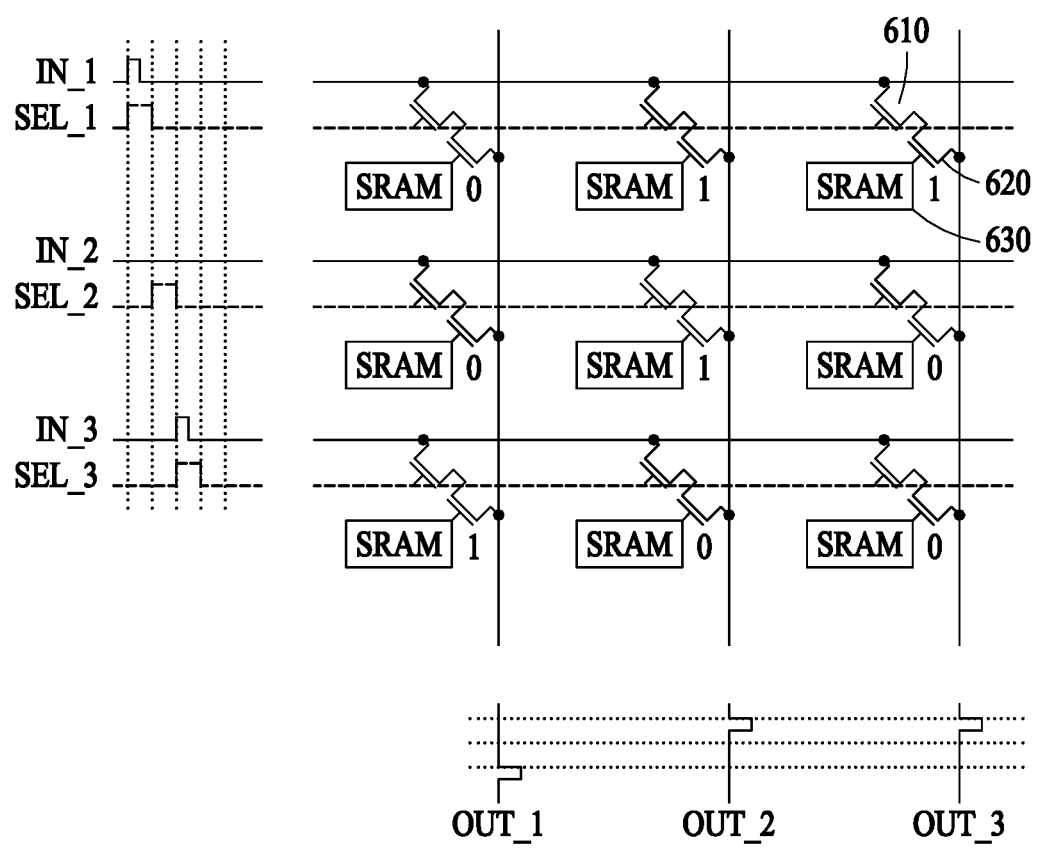
FIG. 6 illustrates an example of an operation of a computing device in which each element includes two transistors and a memory device.

FIG. 6 illustrates an example of an operation of a computing device in which each element includes two transistors and a memory device.

Referring to FIG. 6, each of the elements 123 of FIG. 1 may include two transistors (e.g., MOSFETs) 610 and 620 and a memory device (e.g., an SRAM) 630. Instead of the diode or transistor described above, the two transistors 610 and 620 and the memory device 630 may be included in an element (or device) that is disposed at a cross point between a corresponding input line and a corresponding output line.

The two transistors 610 and 620 included in each element may be connected in series. The two transistors 610 and 620 may include a first transistor 610 and a second transistor 620. Of the first transistor 610, one end (e.g., a source end) may be connected to a corresponding input line, and another end (e.g., a drain end) may be connected to one end (e.g., a source end) of the second transistor 620. A gate end of the first transistor 610 may be connected to a corresponding selection line. To each selection line, a selection signal may be input in the same cycle in which a pulse based on an input signal is input or not input to a corresponding input line. The selection signal may be input to a gate end of a plurality of first transistors disposed in the same input line. A width of the selection signal which is high may be greater than a width of the input signal which is high. In addition, a time at which the selection signal falls from high to low may be behind a time at which the input signal falls from high to low. Due to such a pulse width difference, an output line may be pulled down from high to low without a separate pull-down resistor or transistor.

Of the first transistor 610, both ends (e.g., the source end and the drain end) may be short-circuited in a cycle in which a pulse based on an input signal is input or not input, based on the selection signal. An operation of the first transistor 610 may be irrespective of a corresponding input signal or a corresponding weight.

Of the second transistor 620, one end (e.g., a source end) may be connected to the other end (e.g., the drain end) of the first transistor 610, and another end (e.g., a drain end) may be connected to a corresponding output line. A gate end of the second transistor 620 may be connected to a corresponding memory device 630. The memory device 630 may store a corresponding weight. For example, when the memory device 630 stores therein the weight which is a first value (e.g., 1), the second transistor 620 may short-circuit the one end and the other end, and transfer a pulse applied to the corresponding input line to the corresponding output line. In contrast, when the memory device 630 stores therein the weight which is a second value (e.g., 0), the second transistor 620 may open the one end and the other end, and prevent the pulse applied to the input line from being transferred to the output line.

Unlike the examples described above with reference to FIGS. 2 and 3, elements may be disposed at all cross points between input lines and output lines, and each memory device may store a corresponding weight. Thus, it may not be necessary for a neural network to be fixed, and weights by the neural network may be stored in memory devices. Thus, various neural networks may be executed.

For descriptions of others, in addition to a description of elements disposed in input lines and output lines, for example, that a pulse based on an input signal is sequentially input or not input to a plurality of input lines, that an output signal is determined by counting the number of pulses output from an output line through a pulse counter, and the like, reference may be made to what has been described above with reference to FIGS. 2 and 3.

Although each memory device is illustrated as an SRAM in FIG. 6 for convenience of description, any memory device that may be connected to a gate end of a transistor may also be applied without limitation.

Figure 7:
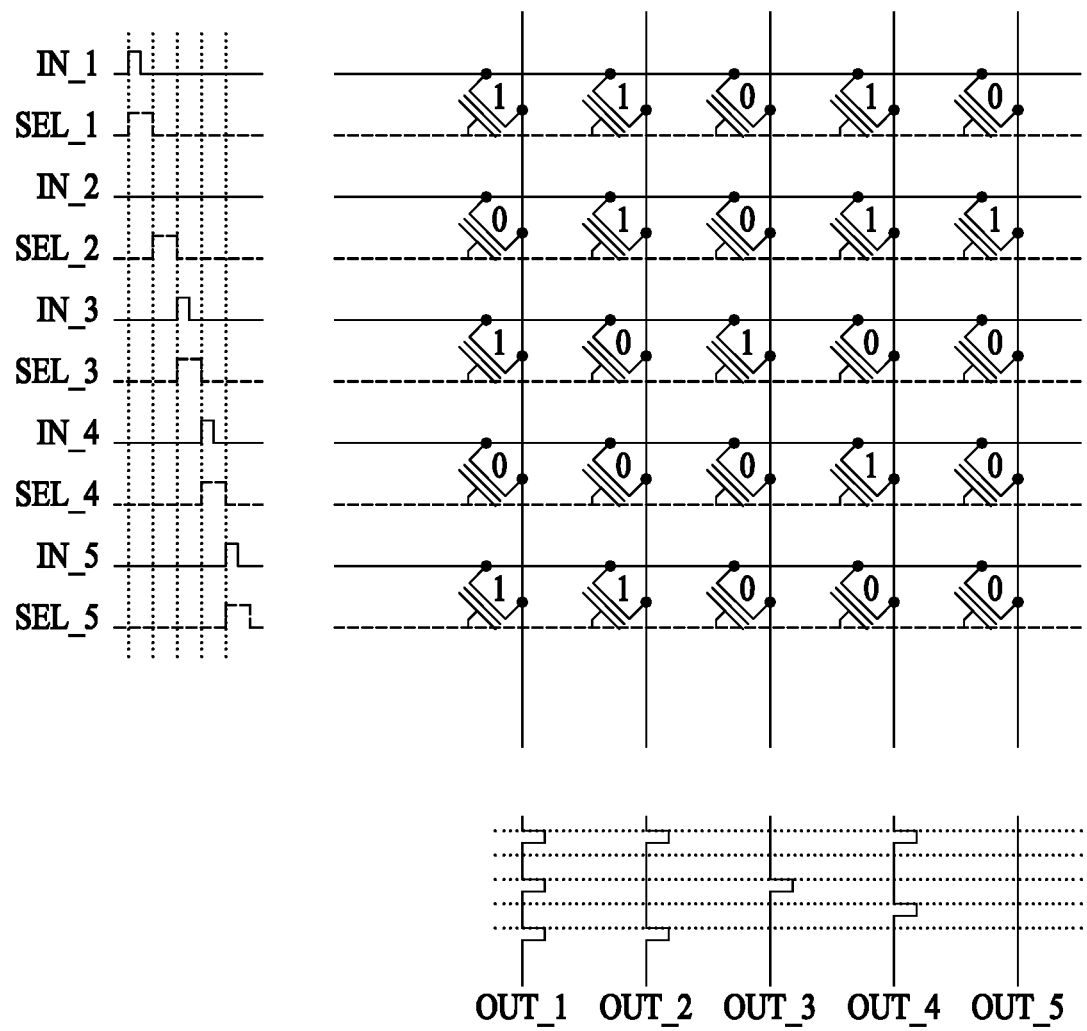
FIG. 7 illustrates an example of an operation of a computing device including a flash memory.

FIG. 7 illustrates an example of an operation of a computing device including a flash memory.

Referring to FIG. 7, each of the elements 123 of FIG. 1 may be replaced with a second memory device. The second memory device may include, for example, a nonvolatile flash memory. The second memory device may be used instead of the diode or transistor described above. The second memory device may be disposed at all cross points between input lines and output lines, and may short-circuit or open both ends based on a stored weight. Thus, it may not be necessary for a neural network to be fixed, and weights by the neural network may be stored in respective second memory devices. Thus, various neural networks may be executed.

Of the second memory device, one end (e.g., a source end) may be connected to a corresponding input line and another end (e.g., a drain end) may be connected to a corresponding output line, and a control gate end may be connected to a corresponding selection line and a floating gate end may store therein a corresponding weight.

To each selection line, a selection signal may be input in the same cycle in which a pulse based on an input signal is input or not input to a corresponding input line. The selection signal may be input to a control gate end of a plurality of second memory devices disposed in the same input line. A width of the selection signal which is high may be greater than a width of the input signal which is high. In addition, a time at which the selection signal falls from high to low may be behind a time at which the input signal falls from high to low. Due to such a pulse width difference, an output line may be pulled down from high to low without a separate pull-down resistor or transistor.

When the control gate end stores a first value (e.g., 1), the second memory device may short-circuit the one end and the other end to transfer a pulse applied the input line to the output line. In contrast, when the control gate end stores a second value (e.g., 0), the second memory device may open the one end and the other end to prevent the pulse applied to the input line from being transferred to the output line.

For descriptions of others, in addition to a description of elements disposed in input lines and output lines, for example, that a pulse based on an input signal is sequentially input or not input to a plurality of input lines, that an output signal is determined by counting the number of pulses output from an output line through a pulse counter, and the like, reference may be made to what has been described above and a more detailed and repeated description will thus be omitted here for brevity.

Although the second memory device is illustrated as a flash memory in FIG. 7 for convenience of description, a ferroelectric field-effect transistor (FeFET) having similar characteristics may also be used instead of the flash memory.

Figure 8:
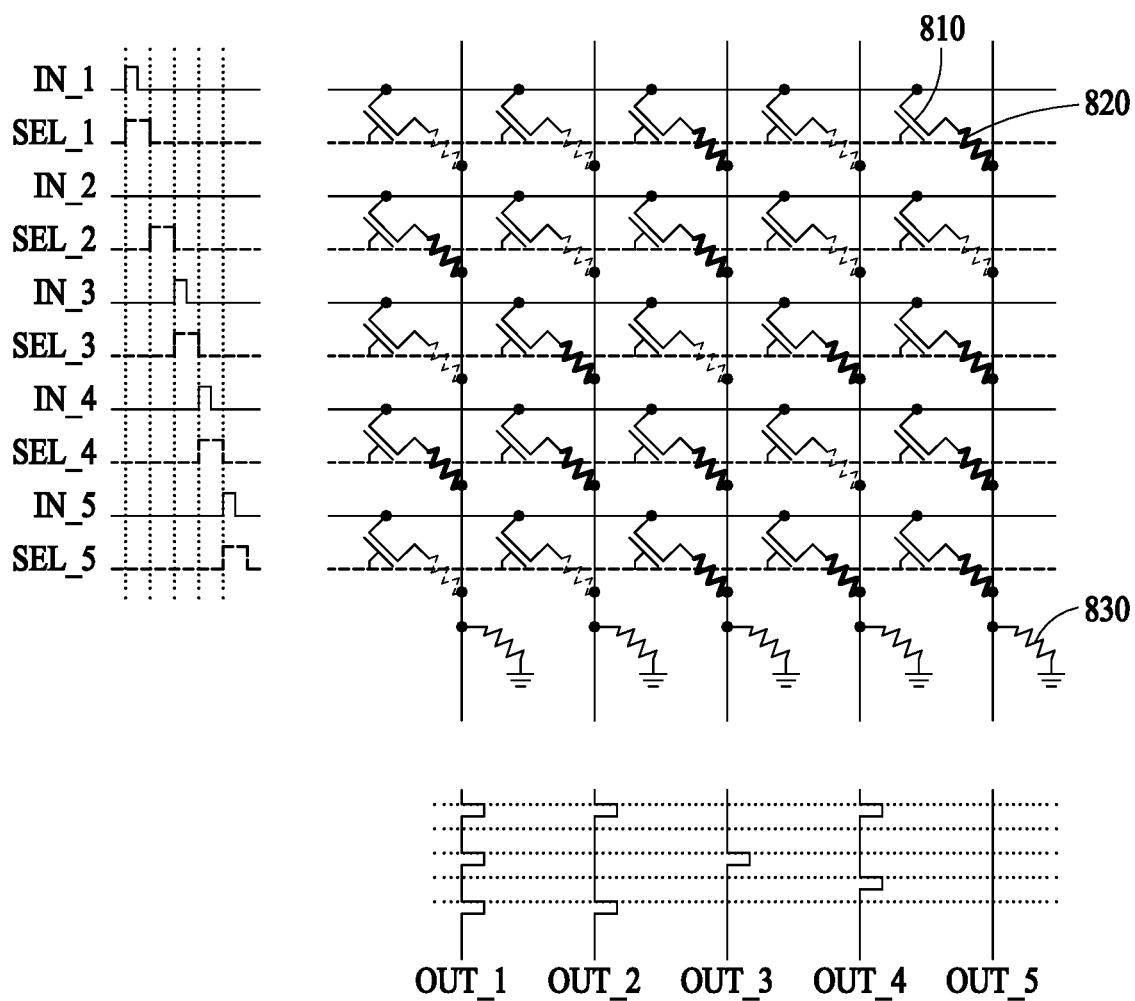
FIG. 8 illustrates an example of an operation of a computing device in which each element includes a transistor and a resistive memory.

FIG. 8 illustrates an example of an operation of a computing device in which each element includes a transistor and a resistive memory.

Referring to FIG. 8, each of the elements 123 of FIG. 1 may be replaced with a transistor (e.g., a MOSFET) 810 and a resistive memory (e.g., a resistive random-access memory (RRAM)) 820. Instead of the diode or transistor described above, the transistor 810 and the resistive memory 820 may be included in an element disposed at a cross point between a corresponding input line and a corresponding output line.

The transistor 810 and the resistive memory 820 included in each element may be connected in series. Of the transistor 810, one end (e.g., a source end) may be connected to a corresponding input line and another end (e.g., a drain end) may be connected to one end of the resistive memory 820, and a gate end may be connected to a corresponding selection line. To each selection line, a selection signal may be input in the same cycle in which a pulse based on an input signal is input or not input to a corresponding input line. The selection signal may be input to a gate end of a plurality of transistors disposed in the same input line. A width of the selection signal which is high may be greater than a width of the input signal which is high. In addition, a time at which the selection signal falls from high to low may be behind a time at which the input signal falls from high to low. While the selection signal is maintained to be high although the input signal falls from high to low, an output line may be pulled down from high to low through the resistive memory 820. The pull-down of the output line may also be performed through a reference resistor 830.

The resistive memory 820 may have a resistance value that varies according to a memory state. Using such a characteristic, a corresponding weight may be represented. For example, the resistive memory 820 may have a first resistance value when the weight is a first value (e.g., 1), and have a second resistance value when the weight is a second value (e.g., 0). The second resistance value may be greater than the first resistance value. For example, the second resistance value may be greater than the first resistance value by a factor of 100 or greater, but is not limited thereto.

The reference resistor 830 may be connected to each output line. Of the reference resistor 830, one end may be connected to a corresponding output line, and another end may be connected to the ground. The reference resistor 830 may have a fixed resistance value, and the fixed resistance value may be greater than the first resistance value and less than the second resistance value. For example, the fixed resistance value may be greater than the first resistance value by a factor of 10 or greater, or be less than the second resistance value by a factor of 1/10 or less.

Based on a resistance ratio $$\frac{R_{FIX}}{R_{RRAM} + R_{FIX}}$$

between the resistive memory 820 and the reference resistor 830, a pulse applied to a corresponding input line may be transferred or not be transferred to a corresponding output line. For example, when the resistive memory 820 has a first resistance value $R_L$, that is, when the weight is the first value, the resistance ratio may be approximated to 1 as represented by Equation 4 below, and a pulse applied to a corresponding input line may be transferred to a corresponding output line.

$$\frac{R_{FIX}}{R_L + R_{FIX}} \approx 1 \qquad \text{Equation 4}$$

In contrast, when the resistive memory 820 has a second resistance value RH, that is, when the weight is the second value, the resistance ratio may be approximated to 0 as represented by Equation 5, and the pulse applied to the input line may not be transferred to the output line.

$$\frac{R_{FIX}}{R_H + R_{FIX}} \approx 0 \qquad \text{Equation 5}$$

The resistance ratio between the resistive memory 820 and the reference resistor 830 may be used to readily implement a binary AND operation between an input signal and a weight.

Figure 9:
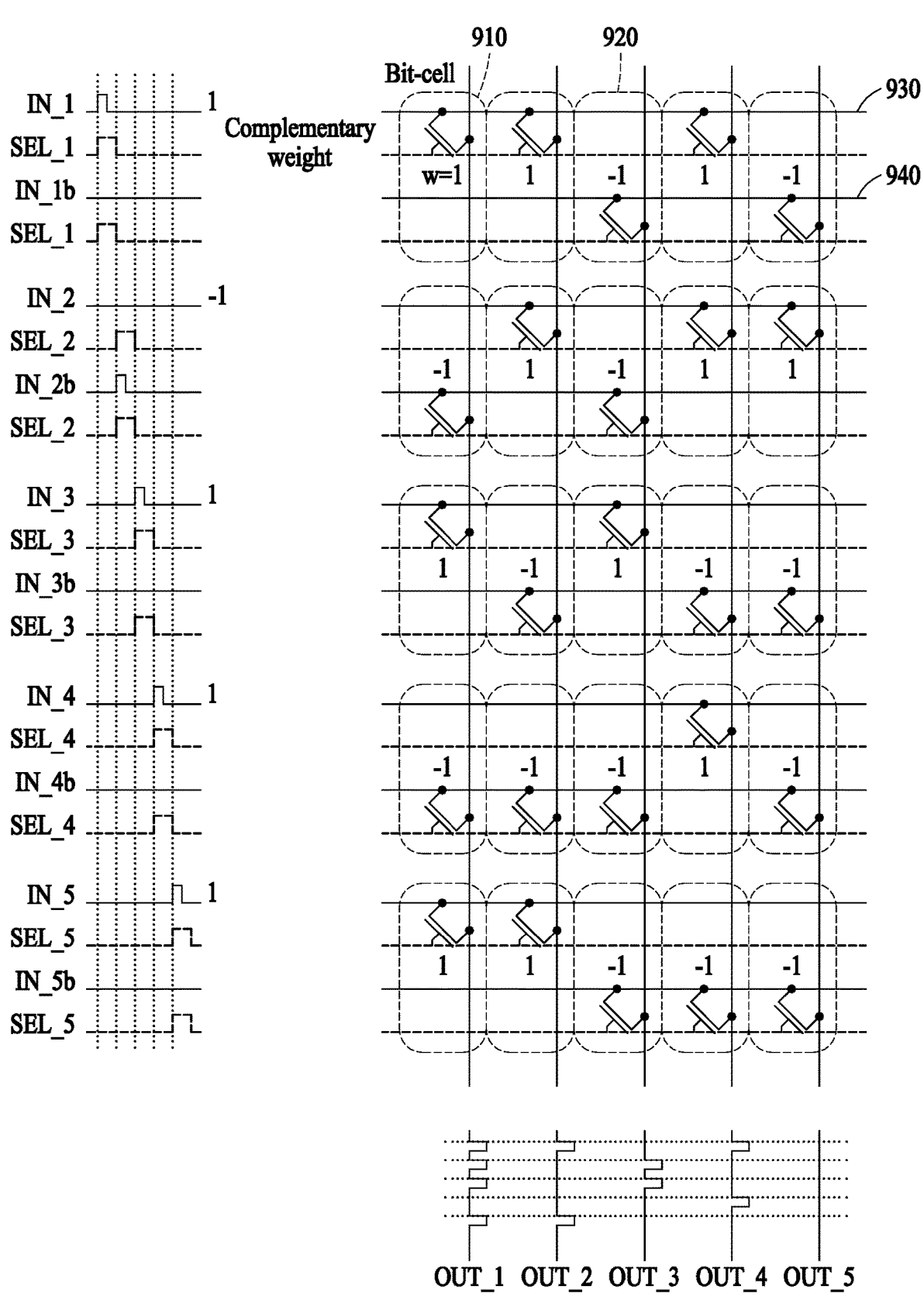
FIG. 9 illustrates an example of an operation of a computing device performing an exclusive NOR (XNOR) bitwise operation.

FIG. 9 illustrates an example of an operation of a computing device performing an exclusive NOR (XNOR) bitwise operation.

In the example of FIG. 9, illustrated is a crossbar array for implementing an XNOR operation.

In an example, a computing device may perform a MAC operation on an input and a weight that have a range of positive values and negative values. For example, the XNOR operation may be performed in elements included in the crossbar array, and a truth table thereof may be represented as in Table 1 below.

TABLE 1

| A | | B | | $\overline{A \oplus B}$ | |
|---|---|---|---|---|---|
| Logical value | Bit value | Logical value | Bit value | Logical value | Bit value |
| 0(L) | −1 | 0(L) | −1 | 1(H) | 1 |
| 0(L) | −1 | 1(H) | 1 | 0(L) | −1 |
| 1(H) | 1 | 0(L) | −1 | 0(L) | −1 |
| 1(H) | 1 | 1(H) | 1 | 1(H) | 1 |

In Table 1, a bit value of −1 may be represented by a logical value of 0, and a bit value of 1 may be represented by a logical value of 1. The bit value may represent a numerical value that is actually calculated, and the logical value may represent a bit symbol assigned to each bit value. The logical value of 0 may be indicated as L, and the logical value of 1 may be indicated as H. As shown in Table 1 above, a result of an XNOR operation between logical values may correspond to a result of a multiplication between corresponding bit values. The crossbar array may process a multiplication between inputs and outputs in a range of positive and negative values through an element-wise multiplication operation.

Although it is described as illustrated in Table 1 above that the logical value of 0 is the bit value of −1 and the logical value of 1 is the bit value of 1 for convenience of description, examples are not limited thereto, but they may be assigned vice versa according to design. For example, the logical value of 1 may be assigned to the bit value of −1, and the logical value of 0 may be assigned to the bit value of 1.

For the XNOR operation, an opposite signal (e.g., IN_1b) of an input signal (e.g., IN_1) may be input to a second input line 940 in the same cycle in which a pulse based on the input signal (e.g., IN_1) is input or not input to an input line 930. Unlike the foregoing examples, an input signal and a corresponding opposite signal may be input to the input line 930 and the second input line 940, respectively, in one cycle to implement the XNOR operation. As the input signal and the opposite signal are respectively input to the input line 930 and the second input line 940, a pulse may be applied to only one of the input line 930 and the second input line 940. For example, when the input signal has a first value (e.g., 1), the opposite signal may have a second value (e.g., 0), and the pulse may be applied only to the input line 930. Conversely, when the input signal has the second value (e.g., 0), the opposite signal may have the first value (e.g., 1), and the pulse may be applied only to the second input line 940.

Each of the elements 123 of FIG. 1 may be replaced with a transistor (e.g., a MOSFET). However, a position at which the transistor is disposed may vary according to a corresponding weight. For example, when the weight is a first value (e.g., 1), the transistor may be disposed at a cross point between a corresponding input line (e.g., the input line 930) and a corresponding output line, and may short-circuit both ends based on a selection signal to transfer the pulse applied to the input line 930 to the output line. Conversely, when the weight is a second value (e.g., 0), the transistor may be disposed at a cross point between a corresponding second input line (e.g., the second input line 940) and a corresponding output line, and may short-circuit both ends based on a selection signal to transfer the pulse applied to the second input line 940 to the output line. As such, the transistor may be configured to be complementary according to a corresponding weight. In the example of FIG. 9, a bit-cell 910 indicates a case in which the weight is 1 (or a bit value is 1), and a bit-cell 920 indicates a case in which the weight is 0 (or a bit value is −1).

By a pulse counter connected to each output line, the number of pulses output from a corresponding output line may be counted. A result of a MAC operation based on a binary XNOR operation between input signals input to a plurality of input lines and weights of elements may be determined based on values output from pulse counters. That a pulse is output to an output line may indicate 1, and that a pulse is not output may indicate −1. A result of a MAC operation for each output line may be determined by multiplying the number of pulses output from a corresponding output line by 2 and subtracting an array size from a resulting value obtained therefrom, which is, "2×OUT−array size." In the example, OUT may denote an output of a pulse counter. In the example of FIG. 9, four pulses are output from a first output line and the array size is 5, and thus "2×4-5=3" may be determined to be the result of the MAC operation based on the binary XNOR operation. The entire operation performed in the example of FIG. 9 may be represented by Equation 6.

$$\begin{bmatrix} 3 \\ -1 \\ -1 \\ -1 \\ -5 \end{bmatrix} = \begin{bmatrix} 1 & -1 & 1 & -1 & 1 \\ 1 & 1 & -1 & -1 & 1 \\ -1 & -1 & 1 & -1 & -1 \\ 1 & 1 & -1 & 1 & -1 \\ -1 & 1 & -1 & -1 & -1 \end{bmatrix} \begin{bmatrix} 1 \\ -1 \\ 1 \\ 1 \\ 1 \end{bmatrix} \quad \text{Equation 6}$$

To obtain the result of the MAC operation based on the binary XNOR operation, an opposite signal corresponding to an input signal may desirably be input to the crossbar array, and thus the array size may be doubled.

FIGS. 10 through 13 illustrate examples of an operation of a computing device performing a multi-bit operation.

The foregoing examples described above may be when an input signal and a weight are a single bit. Hereinafter, implementation of a multi-bit input signal and weight will be described with reference to FIGS. 11 through 13. For convenience of description, implementation of a multi-bit input signal will be described with reference to FIGS. 10 through 12, and implementation of a multi-bit weight will be described with reference to FIG. 13. However, both the input signal and the weight may be implemented as a multi-bit according to examples.

Figure 10:
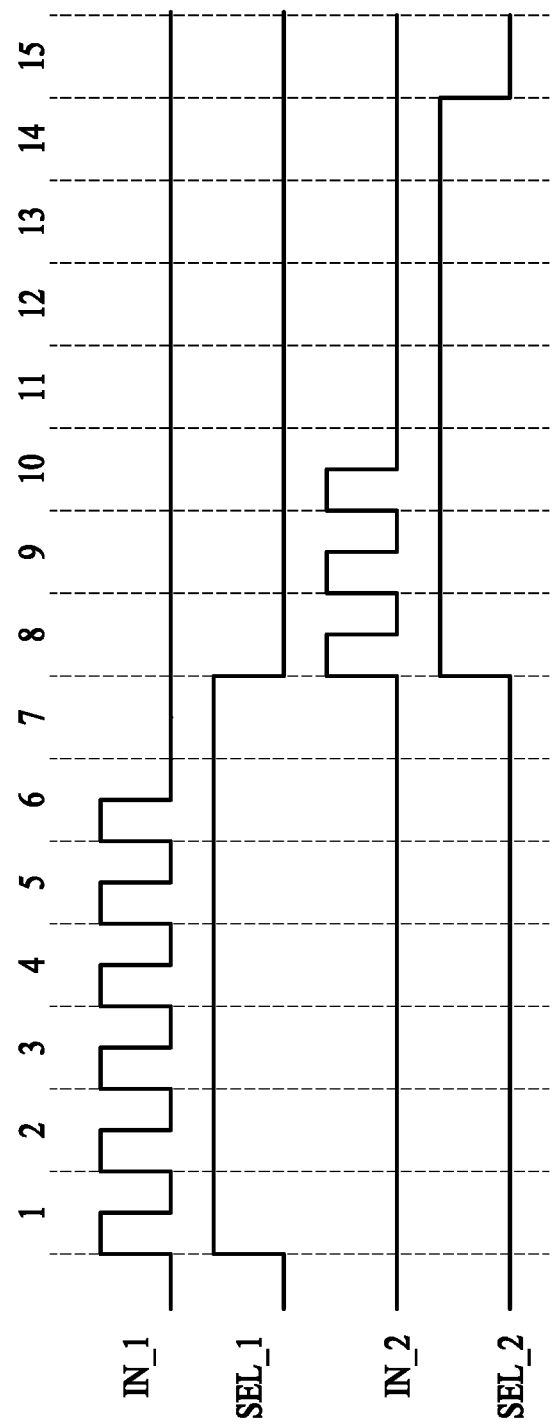
FIGS. 10, 11, 12, and 13 illustrate examples of an operation of a computing device performing a multi-bit operation.

Referring to FIG. 10, a pulse in the form of a thermometer code may be input to a corresponding input line. For example, when an input signal is 3 bits, it may indicate any one between 000 and 111. In the example of FIG. 10, when a first input signal is 110, six pulses in which the first input signal which is 110 is represented in the form of a thermometer code may be sequentially input to a corresponding input line. For example, when a transistor is used in an element in a crossbar array, a selection signal input to a gate end of the transistor may be maintained to be high for 7 cycles for which all the 3 bits are input. When the selection signal is n bits, the selection signal may be maintained to be high for $2n-1$ cycles. In addition, when a second input signal is 011, three pulses in which the second input signal which is 011 is represented in the form of a thermometer code may be sequentially input to a corresponding input line. Although the input signal is illustrated as 3 bits in FIG. 10 for convenience of description, examples are not limited thereto, and various examples may be applied without limitation.

In the example of FIG. 10 illustrating an n-bit input signal, the area of the crossbar array may not increase or decrease, but a computation cycle may increase by $2^n-1$ (in which, n is a natural number).

Figure 11:
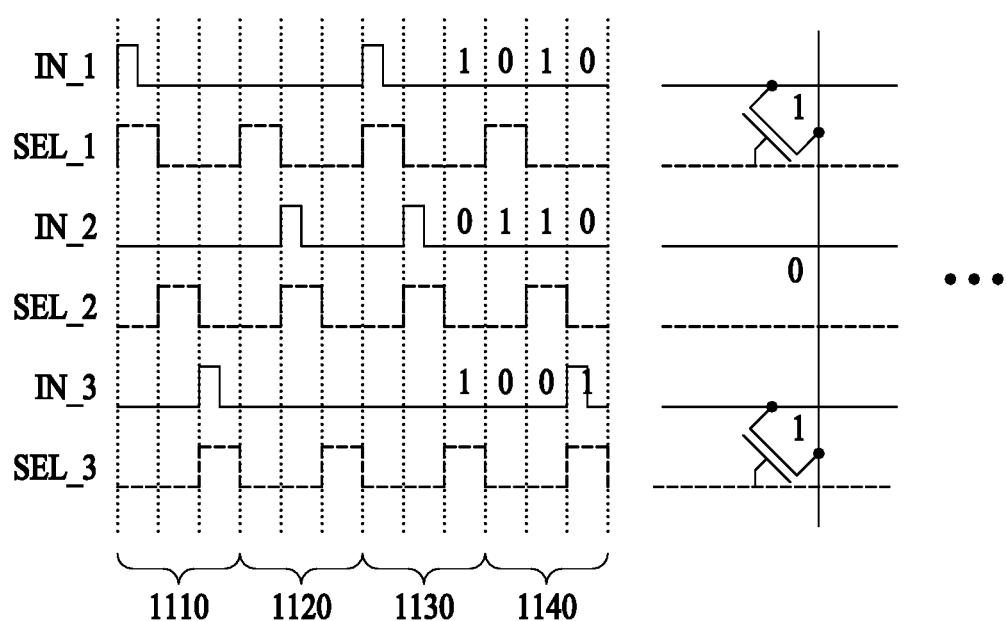

FIG. 11 illustrates an example of applying an input binary weighted multi-bit. Although three input signals represented by 4 bits are illustrated in FIG. 11 as being input to input lines, examples are not limited thereto. In the example of FIG. 11, only a first output line is illustrated, and other remaining output lines are omitted for convenience of description, and the following description of the first output line may be applied to the remaining output lines. In addition, in the example of FIG. 11, elements are illustrated as including a transistor which is described above with reference to FIG. 3, but examples are not limited thereto.

Each of a plurality of input lines may sequentially receive or not receive a pulse based on a value corresponding to the same digit in a corresponding input signal. For example, in first through third cycles 1110, a most significant digit (MSD) of each input signal may be sequentially input to a corresponding input line. Specifically, in a first cycle, a pulse may be input to a first input line based on an MSD of a first input signal which is 1. In a second cycle, a pulse may not be input to a second input line based on an MSD of a second input signal which is 0. In a third cycle, a pulse may be input to a third input line based on an MSD of a third input signal which is 1. In fourth through sixth cycles 1120, a second MSD of each input signal may be sequentially input to a corresponding input line. In seventh through ninth cycles 1130, a third MSD of each input signal may be sequentially input to a corresponding input line. In tenth through 12th cycles 1140, a least significant digit (LSD) of each input signal may be sequentially input to a corresponding input line.

Unlike the foregoing example, a value corresponding to the same digit of each input signal may be sequentially input to a corresponding input line, and thus how the number of pulses output from each output line is to be reflected may vary, which will be described in detail with reference to FIG. 12.

Figure 12:
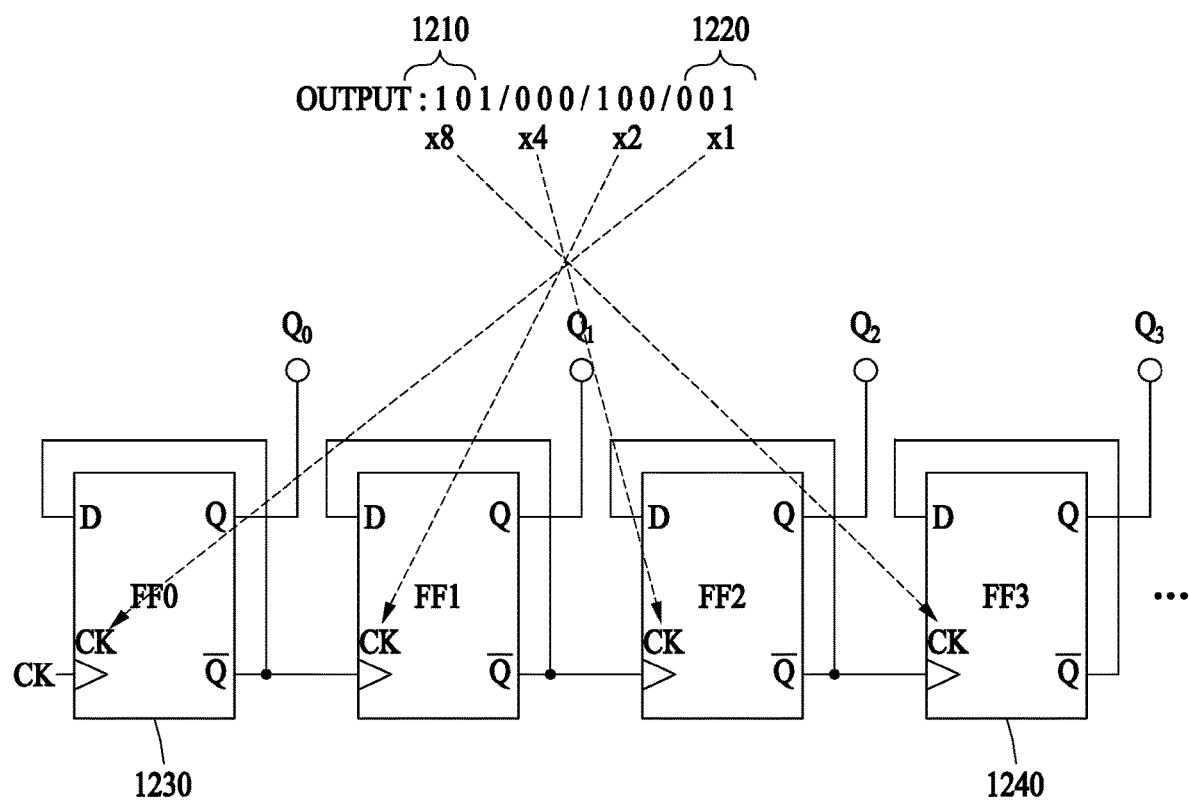

Referring to FIG. 12, in first through third cycles 1210, pulses of a first output line may be output in the first and third cycles. The pulses may be input to a CK end of a fourth T flip-flop 1240 of a pulse counter to be applied to an MSD of an output signal. In tenth through 12th cycles 1220, pulses of the first output line may be output in the 12th cycle. The pulses may be input to a CK end of a first T flip-flop 1230 of a pulse counter to be applied to an LSD of an output signal. Similarly, pulses output in remaining cycles may be transferred to corresponding T flip-flops, through which a multi-bit output signal corresponding to a multi-bit input signal may be determined.

In the example of an n-bit input signal described above with reference to FIGS. 11 and 12, a computation cycle may increase by a factor of n, although there is no increase or decrease in the area of the crossbar array.

Figure 13:
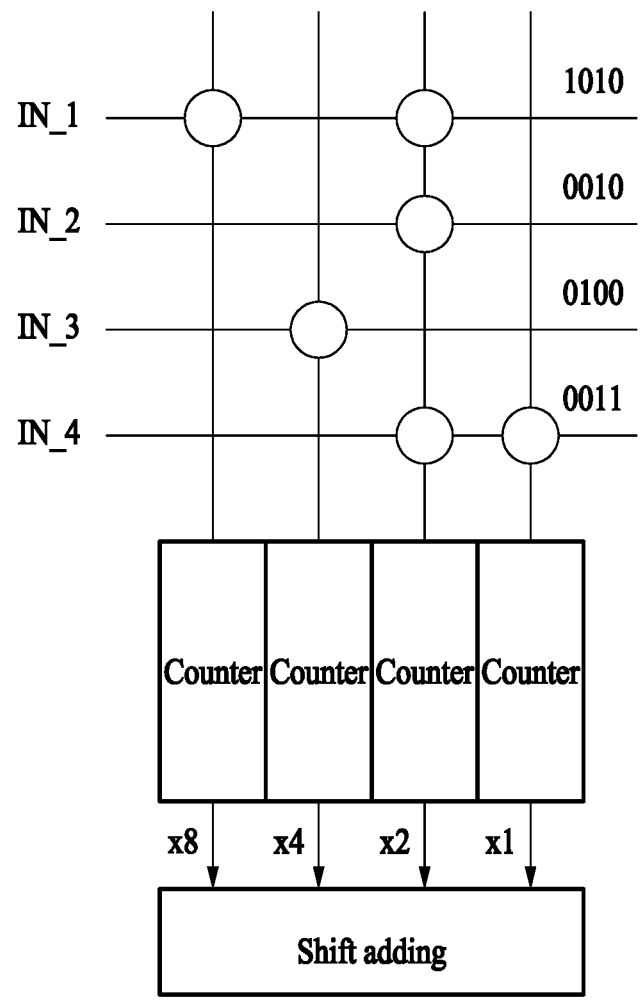

Referring to FIG. 13, illustrated is an example where a weight binary weighted multi-bit is applied. Although a weight is illustrated as 4 bits in FIG. 13 for convenience of description, examples are not limited thereto. In addition, for convenience of description, only output lines corresponding to a first output signal are illustrated in FIG. 13, and output lines corresponding to remaining output signals are omitted. However, examples are not limited to elements illustrated in FIG. 13.

For example, when a weight is n bits, one weight may be represented by elements at a cross point of one input line and n output lines. For example, when a 4-bit weight between a first input signal and a first output signal is 1010, elements may be disposed at cross points of first and third output lines to transfer a pulse applied to a first input line to the output lines. Each of the first through fourth output lines corresponding to the first output signal may be connected to a corresponding pulse counter, and outputs of respective pulse counters may be shift-added. Through this shift-addition, an output of a first pulse counter connected to the first output line may be applied to an MSD of the first output signal, and an output of a fourth pulse counter connected to the fourth output line may be applied to an LSD of the first output signal. Likewise, outputs of remaining pulse counters may be applied to corresponding digits. Through this, a weight may be assigned to each output line, and a multi-bit output signal to which a multi-bit weight is applied may be determined.

In the example of an n-bit weight described above with reference to FIG. 13, the area of the crossbar array may increase by a factor of n, although there is no increase or decrease in a computation cycle.

Figure 14:
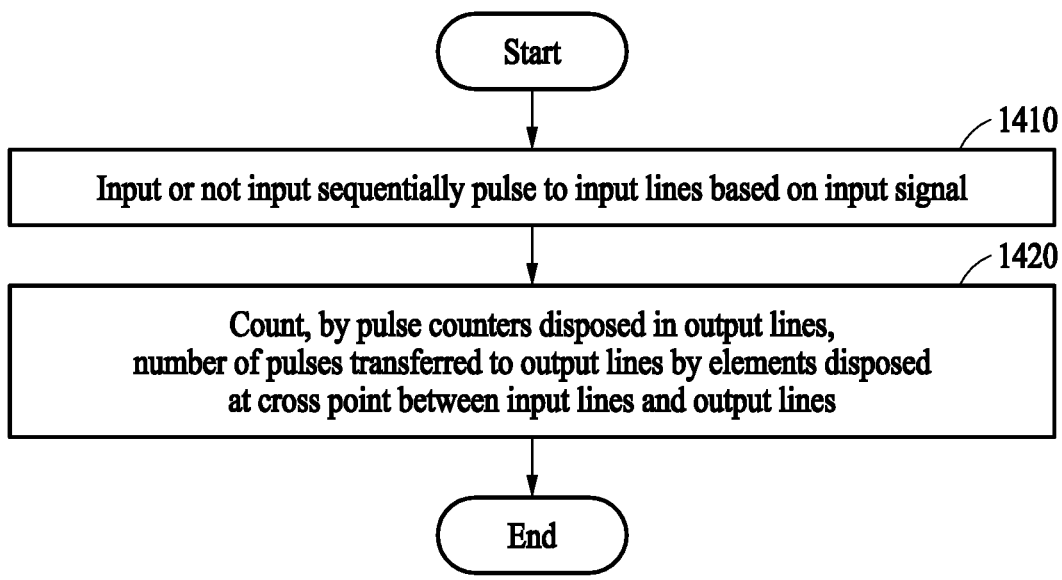
FIG. 14 illustrates an example of a method of operating a computing device.

FIG. 14 illustrates an example of a method of operating a computing device.

Operations to be described hereinafter with reference to FIG. 14 may be performed in sequential order, but are not necessarily performed in sequential order. For example, the order of the operations may change, and at least two of the operations may be performed in parallel. The operations, for example, operations 1410 and 1420, may be performed by at least one component of a computing device described herein.

The computing device may be implemented as one of various devices including computing devices (e.g., a mobile phone, a smartphone, a tablet computer, an e-book device, a laptop, a personal computer (PC), and a server), wearable devices (e.g., a smartwatch, smart eyeglasses, a head-mounted display (HDM), and smart clothes), home appliances (e.g., a smart speaker, a smart television (TV), and a smart refrigerator), and other devices (e.g., a smart vehicle, a smart kiosk, an Internet of things (IoT) device, a walking assistant device (WAD), a drone, and a robot), or as a portion of the device.

In operation 1410, the computing device may or may not input a pulse to a plurality of input lines sequentially, based on a corresponding input signal.

In operation 1420, the computing device may count, by a plurality of pulse counters respectively disposed in output lines, the number of pulses that are transferred to corresponding output lines by a plurality of elements each disposed at a cross point between a corresponding input line and a corresponding output line.

The input lines may cross the output lines. When a corresponding weight is a first value, an element may transfer a pulse input to a corresponding input line to a corresponding output line.

For a detailed description of operations 1410 and 1420, reference may be made to what has been described above with reference to FIGS. 1 through 13.

The computing device, and other devices, apparatuses, units, modules, and components described herein with respect to FIGS. 1-4 and 6-13 are implemented by hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

The methods illustrated in FIGS. 1-14 that perform the operations described in this application are performed by computing hardware, for example, by one or more processors or computers, implemented as described above executing instructions or software to perform the operations described in this application that are performed by the methods. For example, a single operation or two or more operations may be performed by a single processor, or two or more processors, or a processor and a controller. One or more operations may be performed by one or more processors, or a processor and a controller, and one or more other operations may be performed by one or more other processors, or another processor and another controller. One or more processors, or a processor and a controller, may perform a single operation, or two or more operations.

Instructions or software to control computing hardware, for example, one or more processors or computers, to implement the hardware components and perform the methods as described above may be written as computer programs, code segments, instructions or any combination thereof, for individually or collectively instructing or configuring the one or more processors or computers to operate as a machine or special-purpose computer to perform the operations that are performed by the hardware components and the methods as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions herein, which disclose algorithms for performing the operations that are performed by the hardware components and the methods as described above.

The instructions or software to control computing hardware, for example, one or more processors or computers, to implement the hardware components and perform the methods as described above, and any associated data, data files, and data structures, may be recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card micro or a card (for example, secure digital (SD) or extreme digital (XD)), magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, in addition to the above disclosure, the scope of the disclosure may also be defined by the claims and their equivalents, and all variations within the scope of the claims and their equivalents are to be construed as being included in the disclosure.

What is claimed is:

1. A computing device, comprising:
    a plurality of input lines to which a respective pulse is selectively input in a sequential manner based on a corresponding input signal;
    a plurality of output lines crossing the input lines;
    a plurality of elements, each element being disposed at a cross point between a corresponding input line and a corresponding output line and configured to transfer, to the corresponding output line, the respective pulse from the corresponding input line in response to a corresponding weight being a first value and a receipt of corresponding selection signal that overlaps in time with the respective pulse, where the receipt of the corresponding selection signal is maintained at a same level after cessation of the respective pulse; and
    a plurality of pulse counters, each pulse counter being configured to count a number of pulses output from a respective output line of the output lines,
    wherein, for the selective input of the respective pulse, the respective pulse is input to one or more of the input lines when the corresponding input signal is a first value, and the respective pulse is not input to the one or more of the input lines when the corresponding input signal is a second value.

2. The computing device of claim 1, further comprising:
    a plurality of second elements, each second element being configured to transfer, to a ground, a pulse transferred to a corresponding output line.

3. The computing device of claim 1, wherein each of the elements is a transistor,
    wherein one end of each transistor is connected the corresponding input line and another end is connected to the corresponding output line, and a gate end is connected to a selection line corresponding to the respective input line, and
    wherein, when the respective pulse is selectively input based on the corresponding input signal, the selection signal is input to the selection line.

4. The computing device of claim 3, wherein the selection signal is a second pulse having a width greater than a width of the respective pulse input to the corresponding input line.

5. The computing device of claim 1, wherein each of the pulse counters is configured to count the number of pulses transferred from the respective output line during an entire cycle in which the respective pulses are selectively input to the input lines.

6. The computing device of claim 1, wherein a result of a multiply-accumulate (MAC) operation based on a binary AND operation between input signals input to the input lines and weights of the elements is determined based on values output from the pulse counters.

7. The computing device of claim 1, wherein each of the elements comprises:
- a first transistor having a first end connected to the corresponding input line and another first end connected to a second end of a second transistor, and a first gate end connected to a selection line, which provides the selection signal, that corresponds to the corresponding input line; and
- the second transistor having the second end connected to the other first end of the first transistor and another second end connected to the corresponding output line, and a second gate end connected to a corresponding first memory device, wherein the first memory device is configured to store the corresponding weight,
- wherein, in response to the corresponding weight stored in the first memory device being the first value, the second transistor is configured to short-circuit the second end and the other second end, and
- in response to the corresponding weight being a second value, the second transistor is configured to open the second end and the other second end.

8. The computing device of claim 1, wherein each of the elements is a memory device having one end connected to the corresponding input line and another end connected to the corresponding output line, and a control gate end connected to a selection line, which provides the selection signal, that corresponds to the corresponding input line and a floating gate end configured to store the corresponding weight,
- wherein, in response to the corresponding weight being the first value, the memory device is configured to short-circuit the one end and the other end, and
- in response to the corresponding weight being a second value, the memory device is configured to open the one end and the other end.

9. The computing device of claim 1, wherein each of the elements comprises:
- a transistor having a first end connected to the corresponding input line and another first end connected to a second end of a resistive memory, and a first gate end connected to a selection line, which provides the selection signal, that corresponds to the corresponding input line; and
- the resistive memory having the second end connected to the other first end of the transistor and another second end connected to the corresponding output line, and configured to have a resistance value corresponding to the corresponding weight,
- wherein, in response to the corresponding weight being the first value, the resistive memory has a first resistance value,
- in response to the corresponding weight being a second value, the resistive memory has a second resistance value that is greater than the first resistance value, and
- wherein the computing device further comprises a plurality of reference resistors, each of the reference resistors being disposed between a corresponding one of the respective output lines and a ground, and each of the reference resistors has a reference resistance value between the first resistance value and the second resistance value.

10. The computing device of claim 1, further comprising:
- a plurality of second input lines to which other respective pulses are selectively input in the sequential manner based on opposite signals of the corresponding input signals; and
- a plurality of complementary elements, each complementary element being disposed at a cross point between a corresponding second input line and a corresponding one of the output lines in response to an opposite value of the weight being a first value, and configured to transfer the other respective pulse input to the corresponding second input line to the corresponding one of the output lines,
- wherein each of the elements and each of the complementary elements has a corresponding gate end that is connected to a respective selection line that respectively corresponds to a corresponding one of the input lines and a corresponding one of the second input lines is connected, and
- when the other respective pulse is selectively input based on the input signal, the selection signal is input to the corresponding selection line.

11. The computing device of claim 10, wherein a result of a MAC operation based on a binary exclusive NOR (XNOR) operation between input signals input to the input lines and weights of the elements is determined based on values output from the pulse counters.

12. The computing device of claim 1, wherein, in response to the corresponding input signals representing an n-bit input signal, each of the input lines is configured to selectively receive one or more pulses during 2n cycles according to the n-bit input signal.

13. The computing device of claim 1, wherein, in response to the corresponding input signals representing a multi-bit input signal, each of the input lines is configured to selectively receive sequentially the respective pulse according to a value corresponding to a same digit in the multi-bit input signal, and
- each of the pulse counters is configured to apply a pulse transferred from a corresponding output line to a corresponding digit in a multi-bit output signal, based on a digit in the input signal corresponding to the pulse output from the corresponding output line.

14. The computing device of claim 1, wherein, in response to a weight to be represented by two or more of the corresponding weights being an n-bit weight, corresponding elements among the elements are disposed in n output lines corresponding to the weight and one corresponding input line, and configured to selectively transfer the respective pulse input to the one corresponding input line to one or more of the n output lines based on the weight, and
- an output signal is determined by applying, to values output from corresponding pulse counters disposed respectively in the n output lines, different weights that are based on positions of the n output lines.

15. The computing device of claim 1, wherein, for the sequential manner of the selectively inputting of the respective pulse to the plurality of input lines, in response to the corresponding input signal being the second value, a cycle during which the respective pulse based on the input signal is not input to the corresponding input line is omitted.

16. The computing device of claim 1, wherein, among input signals input to the input lines, two or more corresponding input signals, for which output lines to which corresponding respective pulses are to be transferred by one or more of the elements do not overlap, are simultaneously input to the corresponding input line.

17. A method of operating a computing device that includes a plurality of input lines, a plurality of output lines crossing the input lines, and a plurality of elements respectively disposed at cross points between the input lines and the output lines, comprising:

selectively inputting a respective pulse to each of the input lines according to a corresponding input signal in a sequential manner;

transferring, by each of the elements to a corresponding output line, the respective pulse from a corresponding input line in response to a corresponding weight being a first value and a corresponding selection signal being received, including overlapping the corresponding selection signal in time with the respective pulse and maintaining the corresponding selection signal at a same level after cessation of the respective pulse; and counting, by a plurality of pulse counters that are each disposed in a respective output line, a respective number of pulses resulting from the transferring to the respective output line;

wherein the selectively inputting of the respective pulse comprises:

in response to the corresponding input signal being the first value, inputting the respective pulse to a corresponding one of the input lines, and in response to the corresponding input signal being a second value, not inputting the respective pulse to the corresponding one of the input lines.

18. A computing device, comprising:

a crossbar array comprising input lines and output lines crossing the input lines at a plurality of cross points; and a plurality of elements, each element being disposed at one of the cross points and configured to transfer a respective pulse selectively applied to a corresponding input line corresponding to the respective cross point to a corresponding output line corresponding to the respective cross point only when a weight associated with the respective cross point is a first value and a corresponding selection signal associated with the respective cross point is received, where the receipt of the corresponding selection signal is maintained at a same level after cessation of the respective pulse, wherein multiple of the elements are disposed along a common input line and are configured to receive a same respective input pulse based on a corresponding input signal, wherein, for the selective application of the respective pulse to the corresponding input line, the respective pulse is input to one or more of the input lines when the corresponding input signal is a first value, and the respective pulse is not input to the one or more of the input lines when the corresponding input signal is a second value.

19. The computing device of claim 18, wherein the corresponding input signal is a binary signal, and multiple of the elements are disposed along a common input line are configured to receive the respective input pulse input through the common input line.

20. The computing device of claim 18, further comprising a plurality of pulse counters, each pulse counter being connected to a respective output line of the output lines and configured to count a number of pulses output from the respective output line.

* * * * *